(12) United States Patent
Lin et al.

(10) Patent No.: US 6,551,916 B2
(45) Date of Patent: *Apr. 22, 2003

(54) BOND-PAD WITH PAD EDGE STRENGTHENING STRUCTURE

(75) Inventors: Shi-Tron Lin, Hsinchu (TW); Chin-Jong Chan, Hsinchu (TW)

(73) Assignee: Winbond Electronics Corp., Hsinchu (TW)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/327,875

(22) Filed: Jun. 8, 1999

(65) Prior Publication Data

US 2002/0115280 A1 Aug. 22, 2002

(51) Int. Cl.[7] .............................................. H01L 21/44
(52) U.S. Cl. ........................ 438/612; 438/614; 257/780; 257/781
(58) Field of Search .................................. 438/612, 614, 438/622, 613, 617, 652, 400, 455, 106, 118, 119; 257/734, 758, 780, 781, 784

(56) References Cited

U.S. PATENT DOCUMENTS 5,659,201 A * 8/1997 Wollesen .................... 257/758
6,100,589 A * 8/2000 Tanaka ....................... 257/758
6,163,075 A * 12/2000 Okushima ................... 257/759
6,261,944 B1 * 7/2001 Mehta et al. ............... 438/624

* cited by examiner

Primary Examiner—Carl Whitehead, Jr.
Assistant Examiner—Thanhha Pham
(74) Attorney, Agent, or Firm—W. Wayne Liauh

(57) ABSTRACT

A bond pad structure for use in wire bonding application during the packaging operation of semiconductor devices which contains a bond frame structure for holding the bond pad in place to prevent bond pad peel-off problem. The bond pad structure is a laminated structure containing a metal bond pad layer, a middle dielectric layer, and an underlying layer formed above a wafer surface. A guard band structure is formed in a spaced apart relationship from the metal bond pad layer which is connected to the underlying layer by a hole-fill. The underlying layer can be a metal layer, a semiconductor layer such as a polysilicon layer, or any material layer which has good adhesion with the hole fill material. The guard band structure exerts a downward force against the middle dielectric layer to help keeping the middle dielectric layer in place. The guard band structure also creates a localized discontinuity in the middle dielectric layer to intercept cracks that may be formed in the middle layer around the edge of the metal bond pad which is believed a main cause of bond pad peel-off problem.

9 Claims, 6 Drawing Sheets

BOND-PAD WITH PAD EDGE STRENGTHENING STRUCTURE

FIELD OF THE INVENTION

The present invention relates to a novel bond-pad structure with improved stability so as to increase production yields in semiconductor packaging applications. More specifically, the present invention relates to a novel bond-pad structure which eliminates or at least minimizes the bond-pad lift-off (or peeling-off) problems often experienced during the wire bonding process in the packaging of integrated circuits (ICs), with minimum additional effort. With the novel bond-pad structure of the present invention, the failure rate in the production yield due to bond-pad lift-off can be substantially reduced without requiring major modifications in the fabrication process or facility. The present invention also relates to a novel process which implements the improved bond-pad design to increase the production yield so as to reduce the overall production costs for the manufacturing of integrated circuit packages, as well as to the printed circuit boards (PCBs) or other integrated circuit packages that incorporate the novel bond-pad structure disclosed herein.

BACKGROUND OF THE INVENTION

During the formation of printed circuit boards (PCBs) or other integrated circuit (IC) packaging processes, the semiconductor devices provided in the printed circuit board can be respectively connected to the outside via a wire-bonding process. In such a process, one or more bonding pads are provided which are in contact with respective parts of the semiconductive device at the outer-most conductive layer thereof. Then, a bonding wire is bonded onto the bond pad so as to allow the semiconductor device to make electric contact with the inner lead of the IC package.

FIG. 1 is a side view showing a typical bond pad structure and how the metal bond pad is positioned relative to other layers in a multi-layered, or laminated, semiconductor device on a wafer surface. Typically, a metal layer ("metal-1, or preferably a "level-1" layer as it can be a non-metal layer) is deposited on top of a dielectric layer (dielectric-1, or bottom dielectric layer), then another dielectric layer (dielectric-2, or middle dielectric layer) is formed on the metal-1 layer. Finally a third dielectric layer (dielectric-3, or top dielectric layer) is deposited on the dielectric-2 layer using a photolithography technique leaving a bond pad window, within which the metal bond pad layer (metal-2 or "level 2") is deposited. Optionally, a chemically resistant sealing material (such as polyimide) can be deposited on top of the dielectric-3 layer to form a passivation layer, which provides improved resistance against moisture, contamination, etc. The passivation layer is then etched with photolithography process to expose the pad opening. This completes the most basic bond-pad formation process, and the bond pad structure is now ready for being connected to a bonding wire. One or more conductive filled-holes can be formed inside the dielectric-2 layer to provide electrical connection between the metal bond pad and the metal-1 layer. Furthermore, more than one bond pads can be stacked together, each being connected to a respective conductive layer which can be not directly underneath the bond pad. However, this part of the bond pad formation is well known in the art and is thus omitted in the drawings.

The bond peel-off problem occurs when the adhesion force between the metal bond pad (i.e., level-2) and the dielectric-2 layer is not strong enough to resist the thermal and mechanical stress that may be experienced during the wire bonding process to bond the bonding wire to the bond pad. This can also occur between any adjacent layers, for example, between the metal bond pad and an underlying polysilicon layer, between a metal layer and a dielectric layer, between a dielectric layer and a polysilicon layer, and between a barrier layer and a dielectric layer, etc. With the dimension of the semiconductor devices becoming increasingly smaller, the bond-pad peel-off problem becomes substantially more profound, and has become a major factor in holding back further progress in increasing production yields.

FIG. 2 shows a side view of a prior art bond pad structure designed to improve the stability of the bond pad by minimizing the bond pad lift-off problem. A contact, i.e., a via, is formed within the dielectric-2 layer which is filled with a level-2 material to form the bond pad open area which is in contact with the underlying level-1 layer. Each of the level-1 or level-2 layer can be a metal or semiconductor (for example, polysilicon) material. This can be a M2-via-M1 structure or a M2-contact-polysilicon structure. M1 indicates a first metal and M2 indicates a second metal. FIG. 2 also shows that a small overhang is also formed which extends from the bond pad open area and is deposited on top of the dielectric-2 layer. As described the metal-1 layer can be a metal layer or a polysilicon layer. Typically, the underlying layer (level-1 layer) has good adhesive characteristic with the metal layer, and the large contact surface provided by the formation of the via provides a substantially enhanced adhesion. However, under the high thermal and/or vibrational stress encountered during the wire bonding process, cracks can be formed in the portion of the dielectric-2 layer underlying the overhang. Once the crack is formed, it can propagate along the interface between the metal bond pad and the dielectric-2 layer, thus causing the bond pad peeling-off to occur.

Typically, the wire bonding process can be approximately categorized into two main types: the gold wire/gold ball bonding process and the aluminum wire wedge bonding process. The aluminum wire wedge bonding process is widely used in chip-on-board (COB) applications in which the aluminum wire is welded to the bond pad via a combination of ultrasonic vibrations and pressure applied to the wedge. The gold wire/gold ball bonding process is typically accomplished by pressing the wire, which is first formed into a ball, against the bond pad at an elevated temperature. The aluminum wire wedge bonding process is generally less accurate in establishing the bonding position and less uniform in the applied bonding pressure, and, hence, it is more prone to the bond peel-off problem relative to the gold wire/ball bonding process, mainly due to the non-uniformity of mechanical and/or thermal stresses.

FIG. 3 shows the cross-section of another prior art improved bond pad structure, in which a plurality of anchors are formed inside the dielectric-2 layer connecting the metal bond pad and the metal-1 layer. The anchors provide newly increased horizontally contacting surface with the metal-1 layer, as well as extra vertically contacting surface with the dielectric-2 layer. Both can contribute to an increased adhesion force and increased stability of the metal bond pad.

Bond-pad peeling-off or lift-off has been a major unsettling problem besetting the integrated circuit packaging industry involving the wire bonding technology. Many possible solutions have been suggested and implemented, as illustrated in the following prior art references.

U.S. Pat. No. 4,060,828 discloses a semiconductor device having a multi-layer wiring structure with an additional through-hole interconnection formed in the insulating layer beneath the bonding pad of the wiring layer. The purpose of the '828 patent is to provide additional, and protected, electrical contact between the bonding pad and another wiring layer therebelow, such that if the exposed portion of the bonding pad is corroded and thus becoming disconnected, the additional electrical contact formed through the insulation layer can still provide the needed connection. While the '828 patent does not directly address the bond pad peel-off problem, the concept of providing a through-hole interconnection structure in the insulation layer immediately underlying the metal layer as disclosed in the '828 patent has been adopted, though mostly in modified form, by essentially all the prior art processes dealing with solving the problem of bond pad peel-off to provide an anchored structure.

U.S. Pat. No. 4,981,061 discloses a semiconductor device which comprises a first insulating layer formed on the major surface of the semiconductor substrate including an active region. A first contact hole is formed at a position in the first insulating layer corresponding to the active region and a first conductive layer is formed in the first contact hole and a portion of the first insulating layer around the contact hole. Then a second insulating layer is formed on the first conductive layer and the first insulating layer, and a second contact hole is formed at a position in the second insulating layer corresponding to the first conductive layer and located above the first contact hole. Subsequently, a second conductive layer is formed on the second insulating layer and fills the second contact hole. Finally a bonding wire is connected to the second conductive layer in regions located above the first and second contact holes. With the structure disclosed in the '061 patent, the pressure applied to the second insulating layer during wire bonding is supported by columnar portions of the first and second conductive layers filled in the first and second contact holes. Thus, the pressure acting on the second insulating layer is reduced to suppress occurrence of cracks.

U.S. Pat. No. 5,309,205 discloses a bond pad structure which is formed by depositing a barrier layer over an underlying region of a semiconductor device, and then depositing a first conductive layer over the barrier layer. The barrier layer and conductive layer are then patterned and etched to define a conductive region. In the '205 patent, the conductive region is formed in the shape of a grid, and a second conductive layer is deposited over the conductive region and a portion of the exposed underlying region. The second conductive layer makes a good adhesive contact with the underlying region, thus preventing bond pad lift off.

U.S. Pat. Nos. 5,248,903 and 5,284,797 disclose a bond pad structure which alleviates bond pad lift problems encountered during wire bonding by providing a composite bond pad, which includes an upper bond pad and a lower bond pad, and an insulating component therebetween. At least one opening is provided through the insulating component, extending from the bottom bond pad to the upper bond pad. The at least one opening is aligned with a peripheral region of the bottom bond pad. A conductive material is then provided which fills the plurality of openings, and electrically connects the top and bottom bond pads. The at least one opening can be a plurality of conductive vias, a ring-like opening extending around the peripheral region, or one or more elongated slit-like openings. The need to form the upper and lower bond pads in a single bond pad structure can substantially increase the production cost.

U.S. Pat. No. 5,309,025 discloses an improved bond pad structure which reduces bond pad lift off problems. The bond pad disclosed in the '025 patent includes a barrier layer, and is formed by first depositing a barrier layer over an underlying region of a semiconductor device, and then depositing a first conductive layer over the barrier layer. The barrier layer and the conductive layer are then patterned and etched to define a conductive region. A plurality of the conductive regions are formed each of which is isolated from the ourside by the formation of an insulative sidewall. A second conductive layer is deposited over the conductive region and a portion of the exposed underlying region. The second conductive layer makes a good adhesive contact with the underlying region, thus preventing bond pad lift off.

U.S. Pat. No. 5,707,894 discloses an improved bonding pad structure and the process for forming the same which reduces the bond pad peeling problem between the bonding pad layer and an underlying layer. The method disclosed in the '894 patent comprises the steps of first forming a plurality of anchor pads on the substrate surface in the bonding pad area. Next, a first insulating layer is formed over the substrate surface and the anchor pads. A plurality of via holes are formed through the first insulating layer which are filled with the same material as a second metal layer, which covers the first insulation layer, so as to form a conductive connection anchor pads and the second metal layer. The via holes have a smaller cross-sectional area than the anchor pads so that the combination of the anchor pads and the second metal form small "hooks" into the first insulating layer that hold the second metal layer (i.e., the bonding pad layer) to the underlying layer.

There are advantages and disadvantages of using the inventions described above. However, in light of the ever-present urgency to reduce production cost in a highly competitive semiconductors market, it is almost imperative to explore other options, which may work alone or additively to the existing techniques, to further ensure the absence of bond pad peel-off problem and improve production yields.

SUMMARY OF THE INVENTION

The primary object of the present invention is to develop an improved bond pad structure with an edge strengthening member for use in wire bonding applications during the packaging operation of integrated circuit devices. More specifically, the primary object of the present invention is to develop an alternative bond pad structure which minimizes the lift-off problem by providing an edge strengthening member so as not to require the use of any of the anchoring techniques suggested in the prior art. However, the technology developed in the present invention can also be used in conjunction with several of the prior art techniques, if this is so desired by the manufacturer.

In the novel bond pad structure of the present invention, the edge strengthening member comprises a guard band which is provided along, and separated from, one or more edges, either completely or partially, of the bond pad. The guard band has an elongated "band" structure and is connected to the level-1 layer through one or more filled-holes. One of the main functions of the bond guard is that it can effectively prevent the propagation of cracks, when they are formed, in the dielectric layer adjacent the bond pad, especially along the interface between the bond pad and the dielectric layer. It has been discovered by the inventors of the present invention that the propagation of cracks is one of the major factors contributing to the bond pad lift-off.

With the edge strengthening of the present invention, an anchoring structure can be provided underneath the bond pad to provide enhanced adhesion. Preferably, the single anchoring structure with a plurality of interconnected line segments as disclosed in a co-pending application by the same inventors is utilized.

One of the most effective ways of stopping the propagation of cracks is to form interlocking structures in the opposing edges of the bond pad and the bond guard. The interlocking structures can be simple teethed structure, or a labyrinthine-type keyed structure for maximum efficiency. One of the advantages of the present invention is that, since a different interlocking structure only involves the use of a different mask, no major additional efforts are required. Thus, the implementation of the improved bond pad structure of the present invention will not result in substantially increased production cost.

BRIEF DESCRIPTION OF THE DRAWING

The present invention will be described in detail with reference to the drawing showing the preferred embodiment of the present invention, wherein.

DETAILED DESCRIPTION OF THE PREFERRED EMBODIMENT

The present invention discloses an improved bond pad structure with an edge strengthening sub-structure for use in wire bonding applications during the packaging operation of integrated circuit devices. The edge strengthening sub-structure comprises a guard band which is provided along, and separated from, one or more edges, either completely or partially, of the bond pad. The guard band has an elongated "band" structure and is connected to the level-1 layer, which, for the purpose of simplicity, can be considered as the underlying metal layer, through one or more filled-holes.

One of the main functions of the guard band is that it can effectively prevent the propagation of cracks, when they are formed, in the dielectric layer adjacent the bond pad, especially along the interface between the bond pad and the dielectric layer. It has been discovered by the inventors of the present invention that the propagation of cracks is one of the major factors contributing to the bond pad lift-off. The present invention not only presents an alternative bond pad strengthening configuration which minimizes the lift-off problem by providing an edge strengthening member so as not to require the use of any of the anchoring techniques suggested in the prior art, the technology developed in the present invention can also be used in conjunction with several of the prior art techniques, if this is so desired by the manufacturer, for maximizing production yields.

Figure 1:
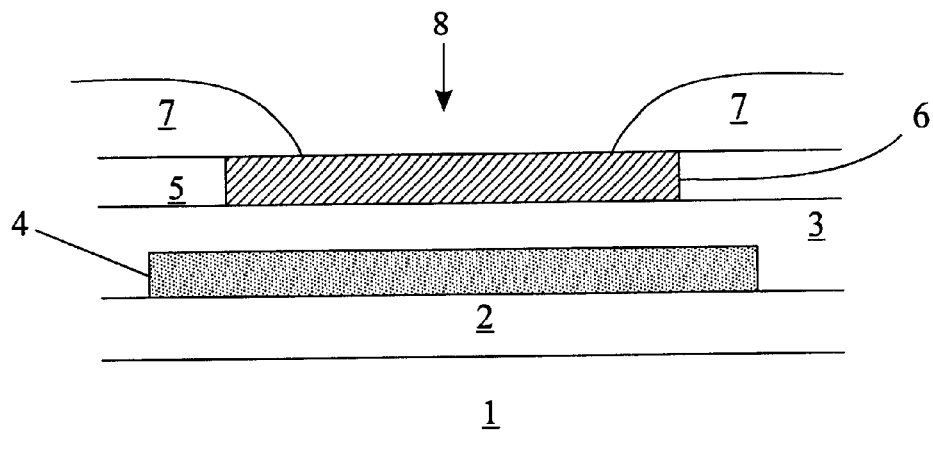
FIG. 1 is an illustrative schematic side view showing a typical bond pad structure and how the metal bond pad is positioned relative to other layers in a multi-layered semiconductor device on a wafer surface.

Now referring to the drawings. FIG. 1 is a side view showing an unimproved conventional bond pad structure and how the metal bond pad is positioned relative to other layers in a multilayered, or laminated, semiconductor device on a wafer surface. Typically, a metal layer 4 (which is also referred to as the "metal-1 " layer) is deposited on top of a dielectric layer 2 (which is also referred to as the "dielectric-i", or "bottom dielectric," layer), then another dielectric layer 3 (which also referred to as the "dielectric-2", or "middle dielectric," layer) is formed on the metal-1 layer 4. The metal-1 layer 4 can also be referred to as the level-1 layer, as it can be made of a non-metal material, which can be a semiconductor or dielectric material.

Finally a third dielectric layer 5 (which is also referred to as the "dielectric-3", or "top dielectric," layer) is deposited on the dielectric-2 layer 3 using a photolithography technique leaving a bond pad window, within which the metal bond pad layer 6 (which is also referred as the "metal-2", or "level 2," layer) is deposited. Optionally, a chemically resistant sealing material (such as polyimide) can be deposited on top of the dielectric-3 layer 5 to form a passivation layer 7, which provides improved resistance against moisture, contamination, etc. The passivation layer 7 is then etched with photolithography process to expose the pad opening 8. This completes the most basic bond-pad formation process, and the bond pad structure is now ready for being connected to a bonding wire. One or more conductive filled-holes (not shown) can be formed inside the dielectric-2 layer to provide electrical connection between the metal bond pad and the metal-i layer. However, this part of the bond pad formation is well known in the art and is thus omitted in the drawings.

Figure 2:
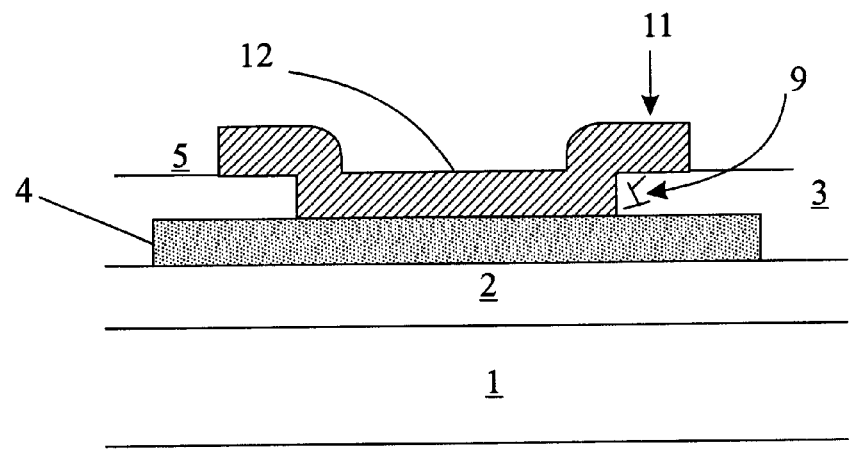
FIG. 2 is an illustrative schematic side view of a prior art bond pad structure designed to improve the stability of the bond pad by minimizing the lift-off problem by forming the bond pad in the form of a via which is in direct contact with the metal layer.

FIG. 2 shows a side view of a prior art bond pad structure designed to improve the stability of the bond pad by minimizing the bond pad lift-off problem. As shown in FIG. 2, a contact, i.e., a via 12, is formed within the dielectric-2 layer 3 which is filled with the metal-2 material as part of the level-1 layer to form the bond pad open area which is in contact with the underlying level-1 layer. Each of the level-1 or level-2 layer can be a metal or semiconductor (for example, polysilicon) material. This can be a M2-via-M1 structure or a M2-contact-polysilicon structure. M1 indicates a first metal and M2 indicates a second metal; they can be the same or different.

FIG. 2 also shows that an overhang portion 11 is also formed which extends from the bond pad open area and is deposited on top of the dielectric-2 layer. As described above the level-1 layer can be a metal layer or a polysilicon layer. Typically, the underlying layer (level-1 layer) has good adhesive characteristic with the level-2 layer, and the large contact surface provided by the formation of the via provides a substantially enhanced adhesion. However, under the high thermal and/or vibrational stress encountered during the wire bonding process, cracks 9 can be formed in the portion of the dielectric-2 layer underlying the overhang 11. Once the crack is formed, it can propagate along the interface between the metal bond pad and the dielectric-2 layer, thus causing the bond pad peeling-off to occur.

Figure 3:
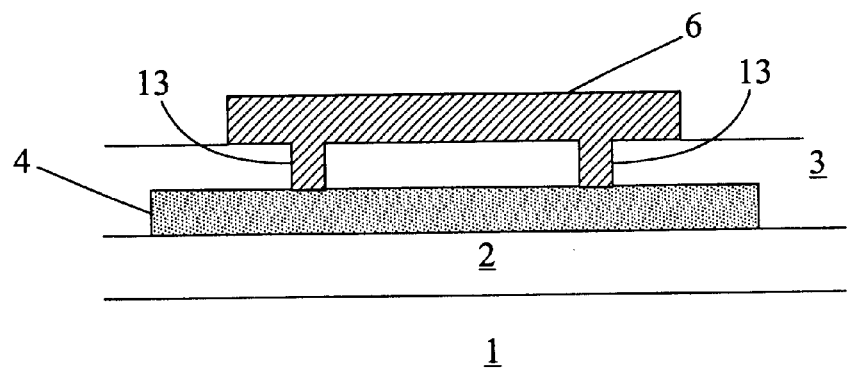
FIG. 3 is an illustrative schematic side view of another prior art improved bond pad structure, in which a plurality of anchors are formed inside the dielectric-2 layer connecting the metal bond pad and the metal-1 layer.

FIG. 3 shows the cross-section of another prior art improved bond pad structure, in which a plurality of anchors 13 are formed inside the dielectric-2 layer 3 connecting the metal bond pad 6 and the metal-1 layer 4. The plurality of anchors 13 provide newly increased horizontally contacting surface with the metal-1 layer 4, as well as extra vertically contacting surface with the dielectric-2 layer 3. Both can contribute to an increased adhesion force and increased stability of the metal bond pad.

With the edge strengthening of the present invention, an anchoring structure can be provided underneath the bond pad to provide enhanced adhesion. Preferably, the single anchoring structure with a plurality of interconnected line segments as disclosed in a co-pending application by the same inventors is utilized.

One of the most effective ways of stopping the propagation of cracks is to form interlocking structures in the opposing edges of the bond pad and the bond guard. The interlocking structures can be simple teethed structure, or a labyrinthine-type keyed structure for maximum efficiency. One of the advantages of the present invention is that, since a different interlocking structure only involves the use of a different mask, no major additional efforts are required. Thus, the implementation of the improved bond pad structure of the present invention will not result in substantially increased production cost.

The bond frame of the present invention can be implemented in a wide range of configurations. To illustrate such flexibility, the present invention will now be described more specifically with reference to the following examples. It is to be noted that the following descriptions of examples, including the preferred embodiment of this invention, are presented herein for purposes of illustration and description, and are not intended to be exhaustive or to limit the invention to the precise form disclosed.

EXAMPLE 1

Figure 4:
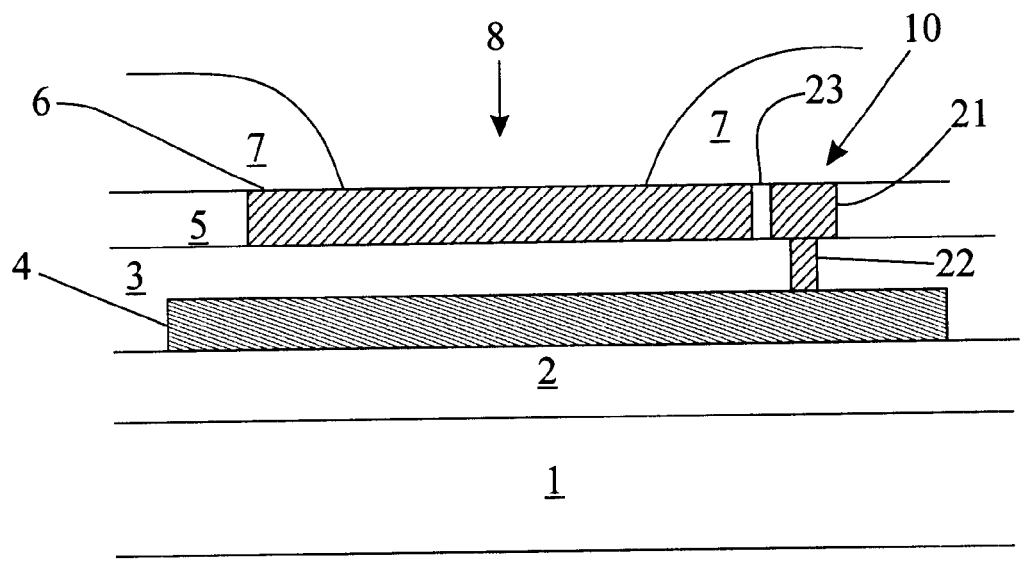
FIG. 4 is an illustrative schematic side view showing the bond guard according the first preferred embodiment of the present invention.

FIG. 4 is an illustrative schematic side view showing the bond pad structure according the first preferred embodiment of the present invention. The bond pad layer 6 (or "metal-1" or "level-2" level) is positioned above the metal-1 layer 4 (or leveL-1 layer), separated by a dielectric-2 layer 3. The level-1 layer 4 is deposited on a dielectric-1 layer 2, which is deposited or grown on a substrate 1. FIG. 4 also shows that the guard band lo is formed along side the bond pad layer 6 on top of the level-1 layer. Finally, a passivation is deposited on the entire wafer surface, and a bond pad open window 8 is formed by a photolithography process. The presence of the guard band 10 prevents the crack growth in the dielectric-2 layer 3, thus preventing the bond pad 6 from being lifted off from the dielectric-3 layer 5.

The guard band 10 of the present invention comprises a band element 21 formed in the level-2 layer. The band element 21 is isolated from the bond pad 6 by an open area, 23. A hole fill (or contact) 22 is provided to connect the band element 21 and the level-1 layer therebetween. It should be noted that the level-1 layer, which is also referred to as the metal-1 layer, can be a non-metal layer which can be a semiconductor layer, such as polysilicon, or a dielectric layer which provides good adhesion with the metal material to be used in the bond frame structure. In other words, the constituting materials for level-2 and level-1 layers can be M2 (second type metal) and M1 (first type metals, respectively. Or they can be M2 and polysilicon, respectively. M1 and M2 can be the same or different from each other.

EXAMPLE 2

Figure 5:
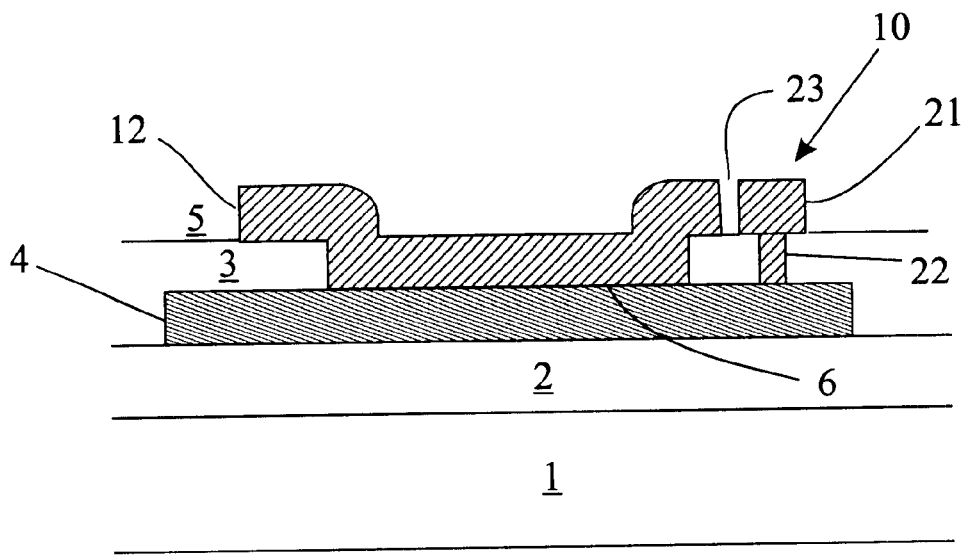
FIG. 5 is an illustrative schematic side view showing the bond guard according the second preferred embodiment of the present invention wherein the bond pad structure contains a via which in contact with the underlying layer.

FIG. 5 is an illustrative schematic side view showing the bond guard according the second preferred embodiment of the present invention wherein the bond pad 6 is extended from its edges so as to contain an overhanging portion 12 sitting on top of the middle dielectric layer 3.

EXAMPLE 3

Figure 6:
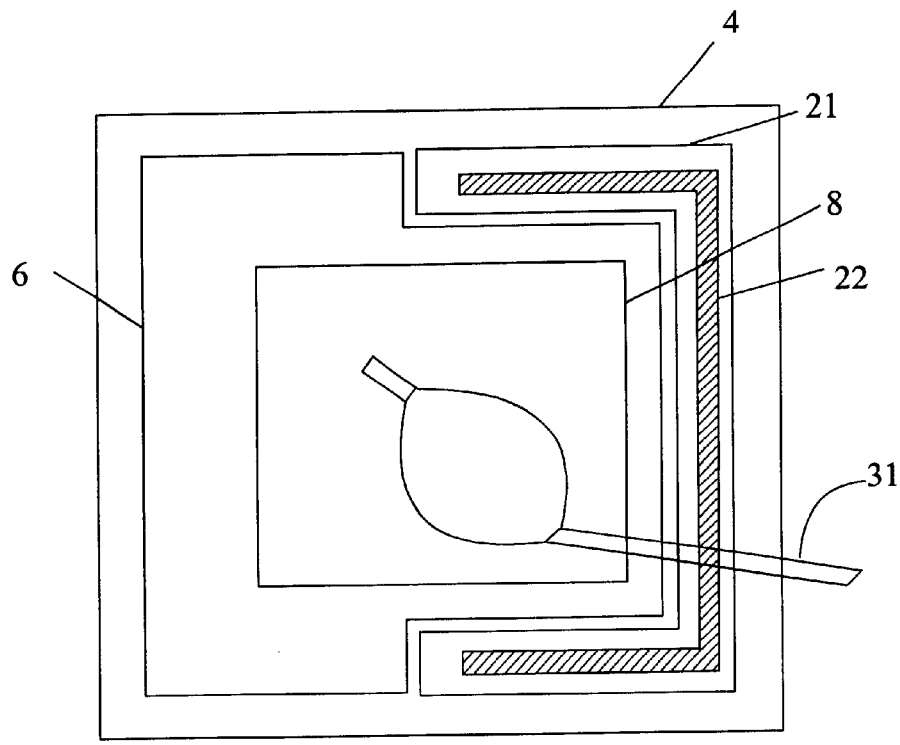
FIG. 6 is an illustrative schematic plan view showing the areal arrangement of the bond guard as shown in FIG. 4, wherein the bond guard comprises an elongated band along one edge of the bond and partially along two adjacent edges; the bond guard is connected to the level-1 layer through a continuous, and similarly U-shaped, filled hole.

FIG. 6 is an illustrative schematic plan view showing an example areal arrangement of the bond guard as shown in FIG. 4. The bond guard comprises an elongated band element 21 along one edge of the bond 6 and partially along two adjacent edges thereof. The band element is connected to the level-1 layer 4 through a continuous, and similarly U-shaped, filled hole 22. FIG. 6 also shows that a bond wire 31 is attached to the bond pad 6 at the bond pad open area 8 thereof.

EXAMPLE 4

Figure 7:
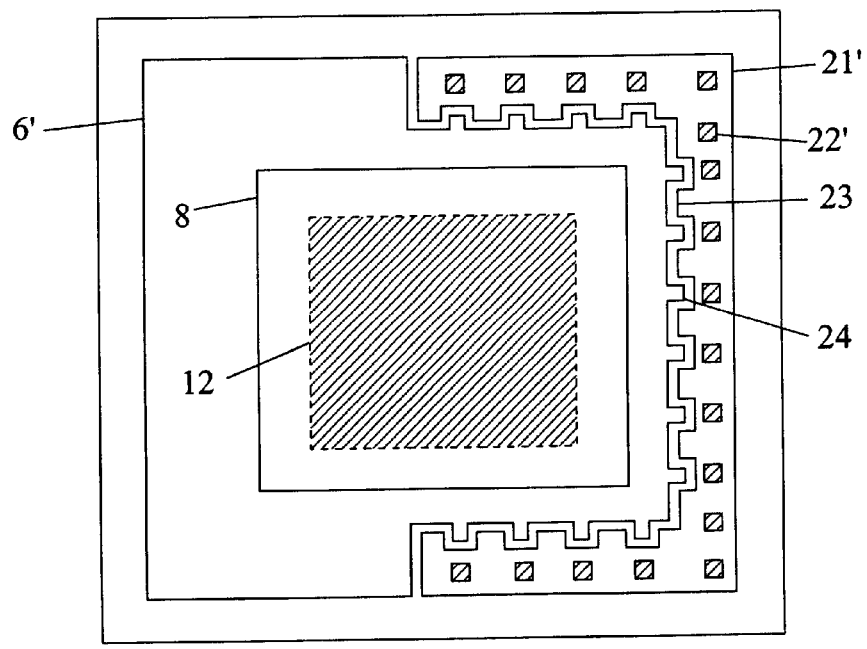
FIG. 7 is an illustrative schematic plan view showing the areal arrangement of a bond guard based on the configuration as shown in FIG. 5, wherein the opposing edges of the bond guard and the bond pad have matching teethed periphery and the bond guard is connected to the level-1 layer through a plurality of filled holes.

FIG. 7 is an illustrative schematic plan view showing an example areal arrangement of a bond guard based on the vertical configuration as shown in FIG. 5. In FIG. 5, it is shown that the opposing edges of the band element 21' and the bond pad 6' have matching teethed peripheries, 23 and 24, respectively, and that the band element 21' is connected to the level-1 layer through a plurality of filled holes 22'.

EXAMPLE 5

Figure 8:
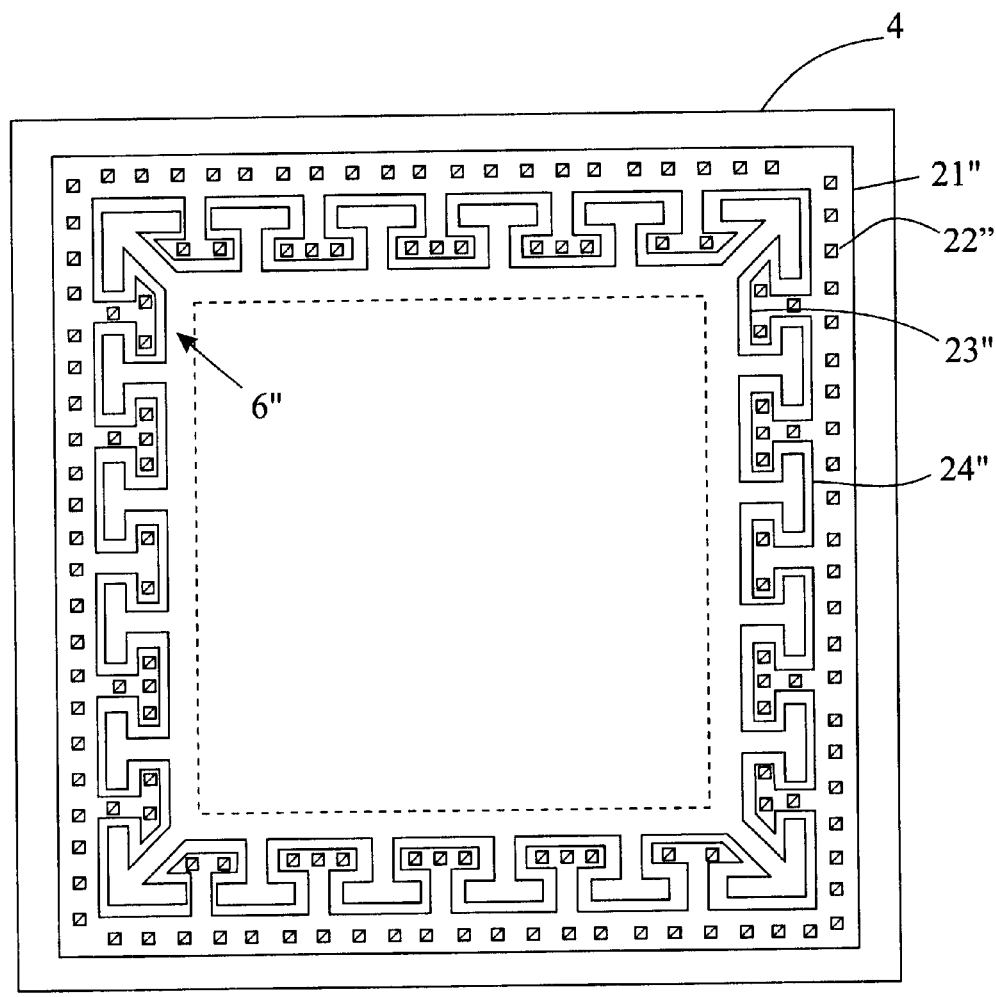
FIG. 8 is an illustrative schematic plan view showing the areal arrangement of a guard band, wherein the opposing edges of the bond guard and the bond pad have matching labyrinthine keyed periphery and the bond guard is connected to the level-1 layer through a plurality of filled holes.

FIG. 8 is an illustrative schematic plan view showing an example areal arrangement of guard band of the present invention, wherein the opposing edges of the band element 21" and the bond pad 6" have matching labyrinthine keyed peripheries, 23" and 24", respectively, and the band element 21" is connected to the level-1 layer 4 through a plurality of filled holes 22".

EXAMPLE 6

Figure 9:
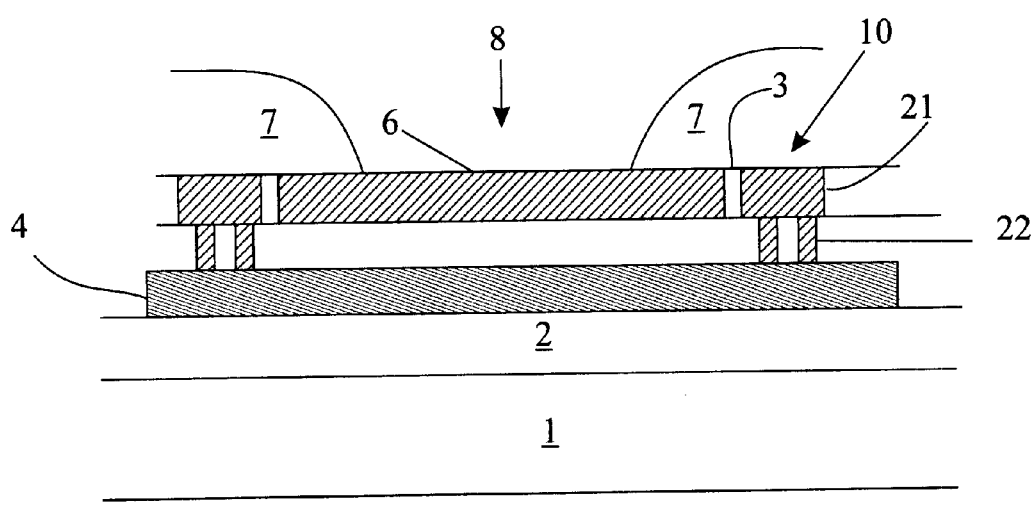
FIG. 9 is an illustrative side view showing a type of guard band configuration similar to that shown in FIG. 4, except that the guard band is connected to the level-1 layer through a plurality of hole fills.

FIG. 9 is an illustrative side view showing a type of guard band configuration similar to that shown in FIG. 4, except that the band element 21 is connected to the level-1 layer 4 through a plurality of hole fills 22.

EXAMPLE 7

Figure 10:
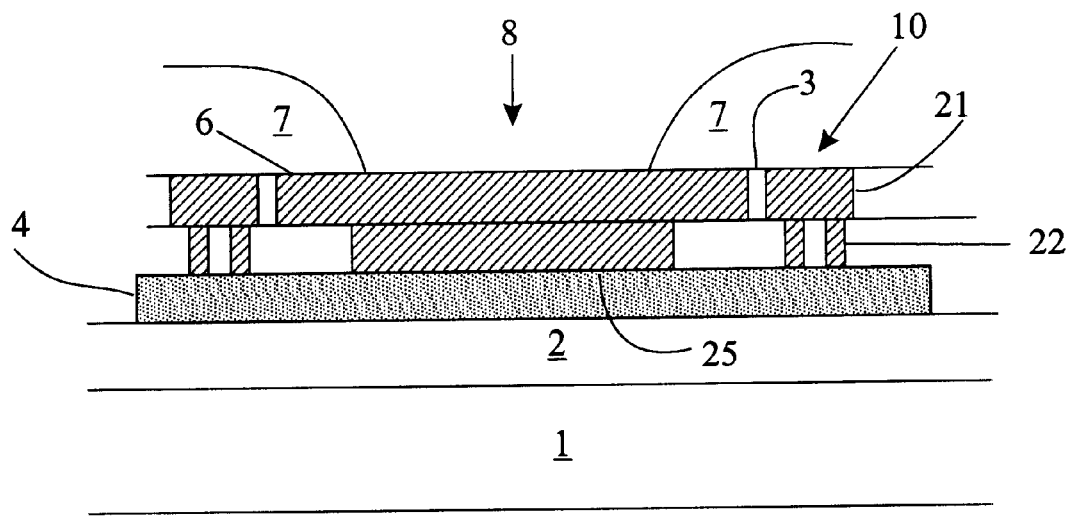
FIG. 10 is an illustrative side view showing a type of guard band configuration similar to that shown in FIG. 9, except that the bond pad is connected to the level-1 layer through an anchoring structure.

FIG. 10 is an illustrative side view showing a type of guard band configuration similar to that shown in FIG. 9, except that the bond pad 6, especially in the bond pad open area 8 thereof, is also connected to the level-1 layer 4 through an anchoring structure 25.

EXAMPLE 8

Figure 11:
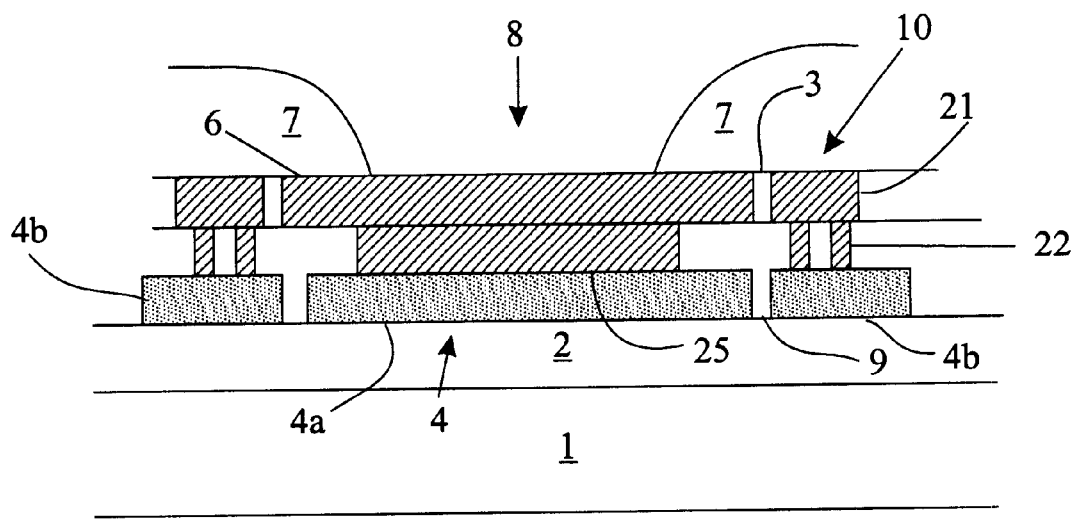
FIG. 11 is an illustrative schematic side view showing a type of vertical guard band configuration similar to that shown in FIG. 10, except that the portion of the level-1 layer connected to the guard band is isolated from the main level-1 layer underneath the bond pad area.

FIG. 11 is an illustrative schematic side view showing a type of vertical guard band configuration similar to that shown in FIG. 10, except that the portion of the level-1 layer 4 connected to the guard band, i.e., 4a, is isolated from the main level-1 layer, i.e., 4b, underneath the bond pad open area 8.

EXAMPLE 9

Figure 12:
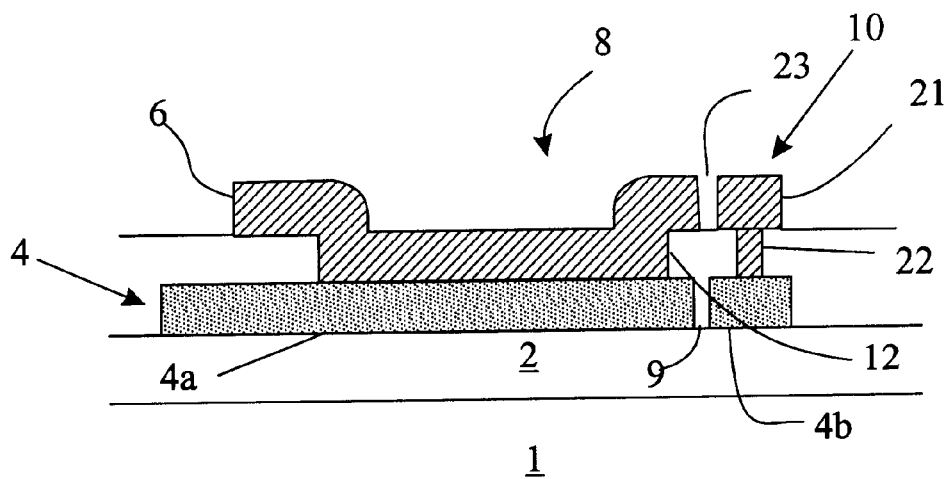
FIG. 12 is an illustrative schematic side view showing a type of vertical guard band configuration similar to that shown in FIG. 5, except that the portion of the level-1 layer connected to the guard band is isolated from the main level-i layer underneath the bond pad area.

FIG. 12 is an illustrative schematic side view showing an example of the vertical guard band configuration similar to that shown in FIG. 5, except that the portion of the level-1 layer 4 connected to the guard band 10, i.e., 4b, is isolated from the main level-1 layer, i.e., 4a, underneath the bond pad open area 8.

EXAMPLE 10

Figure 13:
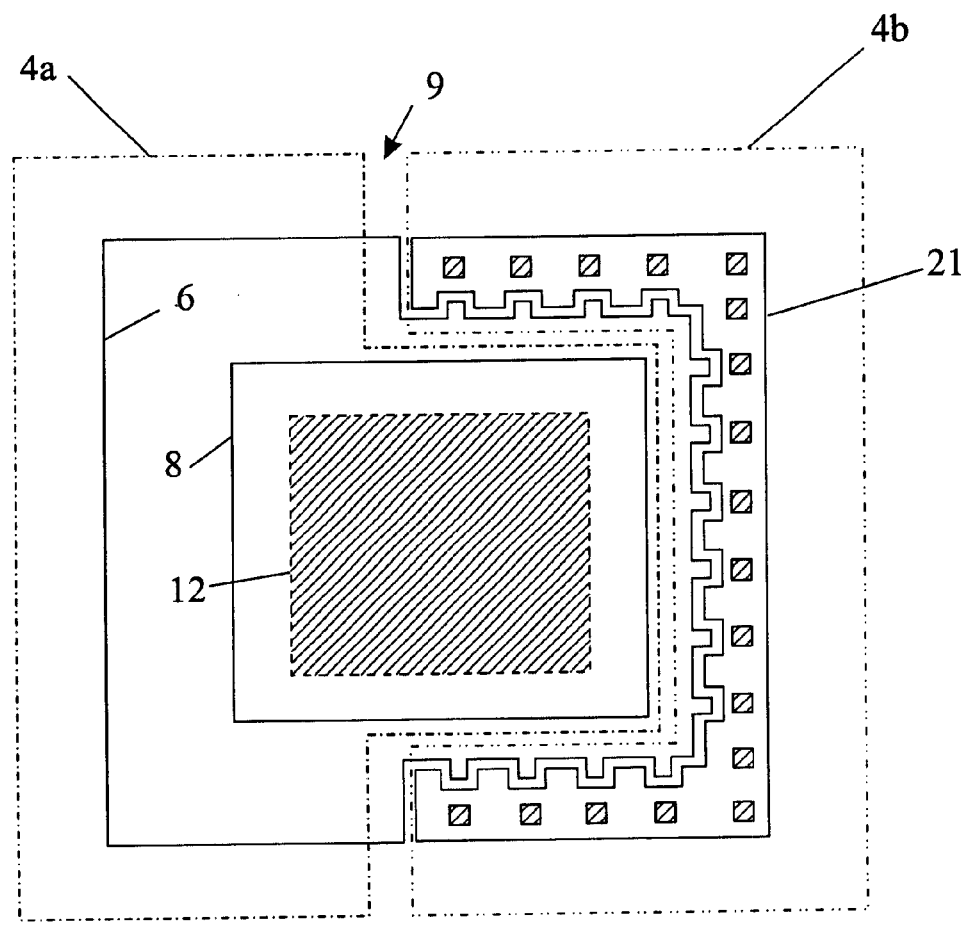
FIG. 13 is an illustrative schematic plan view showing an example of the areal configuration for the guard band shown in FIG. 12.

FIG. 13 is an illustrative schematic plan view showing an example of the areal configuration for the guard band shown in FIG. 12.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method for fabricating a bond pad structure for use in an integrated circuit comprising the steps of:

(a) forming an underlying layer on a wafer surface;

(b) forming a middle dielectric layer on top of said underlying layer, said middle dielectric layer containing a first through-hole formed above said underlying layer;

(c) filling said first through-hole to form a hole fill;

(d) forming a top dielectric layer on top of said middle dielectric layer, said top dielectric layer containing a third through-hole immediately above said first through-hole, and a second through-hole which is spaced apart from said third through-hole, wherein said third through-hole is greater in cross-sectional area than said first through-hole and said second through-hole is substantially greater in cross-sectional area than said third through-hole;

(e) filling said second through-hole and said third through-hole to form a bond pad and a band element, respectively;

(f) where said band element is not connected to said bond pad, and said third through-hole is disposed in a close proximity to said second through-hole such that said band element is effective in intercepting crack that forms when said bond pad is under a stress.

2. The method for fabricating a bond pad structure according to claim 1, wherein said underlying layer is a metal layer or a polysilicon layer.

3. The method for fabricating a bond pad structure according to claim 1, wherein said underlying layer is a polysilicon layer.

4. The method for fabricating a bond pad structure according to claim 1 which further comprises the step of forming an anchoring structure inside said middle dielectric layer which will connect between said bond pad and said underlying layer.

5. The method for fabricating a bond pad structure according to claim 1, wherein said band element has a horizontally elongated structure containing one or more line segments along one or more edges, respectively, of said bond pad.

6. The method for fabricating a bond pad structure according to claim 5, wherein said band element and said bond pad have a matching teethed structure at their respectively opposing sides.

7. The method for fabricating a bond pad structure according to claim 5, wherein said band element and said bond pad have an interlocking keyed structure at their respectively opposing sides.

8. The method for fabricating a bond pad structure according to claim 1, wherein said bond pad structure is formed to contain a plurality of rows of hole fills corresponding to each said band element.

9. The method for fabricating a bond pad structure according to claim 1, wherein said first through-hole is filled by a tungsten plug.

\* \* \* \* \*